(12) United States Patent
Ebinuma et al.

(10) Patent No.: US 10,260,596 B2
(45) Date of Patent: *Apr. 16, 2019

(54) CHAIN COMPONENT AND CHAIN

(71) Applicant: TSUBAKIMOTO CHAIN CO., Osaka-shi, Osaka (JP)

(72) Inventors: Kazuyuki Ebinuma, Osaka (JP); Misa Asada, Osaka (JP); Takashi Kawata, Osaka (JP); Tomoaki Nakayasu, Osaka (JP); Kota Yoshimoto, Osaka (JP); Nobuhiro Uchida, Osaka (JP); Shouta Miyanaga, Osaka (JP)

(73) Assignee: TSUBAKIMOTO CHAIN CO., Osaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/936,714

(22) Filed: Mar. 27, 2018

(65) Prior Publication Data
US 2018/0283497 A1 Oct. 4, 2018

(30) Foreign Application Priority Data

Mar. 28, 2017 (JP) ................. 2017-063547
Mar. 28, 2017 (JP) ................. 2017-063557

(51) Int. Cl.
| | |
|---|---|
| *F16G 13/02* | (2006.01) |
| *F16G 13/06* | (2006.01) |
| *B21L 9/06* | (2006.01) |
| *B21L 9/08* | (2006.01) |
| *C23C 8/24* | (2006.01) |

(Continued)

(52) U.S. Cl.
CPC .............. *F16G 13/06* (2013.01); *B21L 9/065* (2013.01); *B21L 9/08* (2013.01); *C21D 9/0087* (2013.01); *C23C 8/24* (2013.01); *C23C 16/4488* (2013.01); *F16G 13/04* (2013.01); *C21D 1/06* (2013.01); *C23C 8/00* (2013.01); *C23C 8/02* (2013.01);

(Continued)

(58) Field of Classification Search
CPC .......... F16G 13/04; F16G 13/06; F16G 13/08; C23C 8/00; C23C 16/4488; C23C 8/24; C23C 8/02; C23C 8/62; C25D 3/04; B21L 9/065; B21L 9/08; C21D 9/0087; C21D 1/06
USPC ............................................................ 59/78
See application file for complete search history.

(56) References Cited

U.S. PATENT DOCUMENTS 8,550,946 B2 * 10/2013 Ritz ................. F16G 13/08
474/213
8,783,006 B2 * 7/2014 Baba ................. C21D 9/0087
59/35.1

(Continued)

FOREIGN PATENT DOCUMENTS

JP 11-29848 A 2/1999

*Primary Examiner* — David B Jones
(74) *Attorney, Agent, or Firm* — Westerman, Hattori, Daniels & Adrian, LLP

(57) ABSTRACT

Provided are a chain component that has a simple surface treatment structure and can maintain good wear resistance over a long time, and a chain that includes the chain component and maintains good wear elongation resistance. The chain component of a power transmission chain for industrial use includes a chromium nitride layer formed on an outer side of a steel base material and containing more than 0 mass % but not more than 55 mass % iron. At least a surface of the chromium nitride layer that slides against other components is a rough surface with peaks and valleys.

12 Claims, 12 Drawing Sheets

(51) Int. Cl.
*C21D 9/00* (2006.01)
*F16G 13/04* (2006.01)
*C23C 16/448* (2006.01)
C23C 8/02 (2006.01)
C25D 3/04 (2006.01)
F16G 13/08 (2006.01)
C23C 8/00 (2006.01)
C23C 8/62 (2006.01)
C21D 1/06 (2006.01)

(52) U.S. Cl.
CPC .............. *C23C 8/62* (2013.01); *C25D 3/04* (2013.01); *F16G 13/08* (2013.01)

(56) References Cited

U.S. PATENT DOCUMENTS 9,657,810 B2 * 5/2017 Koschig .................. F16G 13/04
9,903,441 B2 * 2/2018 Asada .................... F16G 13/04

* cited by examiner

CHROMIZED SURFACE

CHROMIUM NITRIDE LAYER

CHROMIZED SURFACE

CHROMIUM NITRIDE LAYER

CHAIN COMPONENT AND CHAIN

BACKGROUND OF THE INVENTION

1. Field of the Invention

The present invention relates to chain components such as pins, bushings, link plates, and rollers that constitute power transmission chains for industrial use such as roller chains and silent chains used, for example, as automobile timing chains, and to a chain including these chain components.

2. Description of the Related Art

It has been known that a chromium nitride film formed on a metal surface enhances wear resistance and corrosion resistance of the metal. Chromium nitride film deposition is thus widely practiced in order to increase the life of machine parts, metal molds, tools, and the like.

Chromium nitride films are commonly formed by physical vapor deposition (PVD) methods such as ion plating or sputtering. In the former process, nitrogen gas is introduced during bombardment of a base material by evaporated and ionized Cr in a vacuum chamber. In the latter process, a high voltage applied between a target and a substrate to generate a glow discharge so that Ar ions of the plasma hit the target surface to eject Cr atoms to be deposited on the substrate.

One problem with chromium nitride films formed by a PVD method, when used as the surface treatment layer of highly loaded sliding components of a chain, was that the film would easily peel off of the metal base material such as steel, and that it was difficult to make the film adhere to and unite with the surface of the base material such that it would hardly peel off.

PVD also entails occasional formation of droplets on the surface. When there are droplets, the surface roughness increases, and cracks start to form from the droplets and deteriorate wear resistance. Although droplets can be removed by polishing, there will be holes left where droplets were present. These holes enlarge and join each other as load is applied, because of which the wear resistance cannot be improved.

Because of the cracks and deterioration of wear resistance involved in PVD methods, the film thickness could not be made larger to increase the life.

Another problem was that when the material to be processed is porous, it was difficult to form a film on the inner surfaces of the pores.

Pins used in timing chains of car engines are one example of the machine parts mentioned above. Examples of timing chains include roller chains, bushing chains, and silent chains and the like.

A roller chain has rollers fitted on cylindrical bushings, which are press-fit at both ends into bushing holes of a pair of internal plates, while pins fitted in the bushings are press-fit at both ends into pin holes of a pair external plates that are arranged on both outer sides the pair of internal plates. Bushing chains do not have rollers.

For conventional timing chains, the steel base material of the pins would undergo a chromizing treatment, for the purpose of enhancing the wear resistance of the bushings and pins.

However, timing chains used with much deteriorated engine oil in the car engine room were prone to wear on pins and bushings, because of which their life tended to be short.

Moreover, soot generated in the combustion process of the engine and mixed in the engine oil posed a risk that the friction coefficient of the pins and bushings might increase or the wear might accelerate despite the coating, because lubricating oil containing the soot could penetrate into between the components such as pins and bushings of the timing chain running at high speed under high load, and the soot, which is a hard substance, could damage the coating between the pins and bushings.

Accordingly, a surface treatment that enhances the wear resistance of chains was desired.

Japanese Patent Application Laid-open No. H11-29848 discloses a method of forming chromium nitride films as a solution to the problems entailed in the deposition of chromium nitride films on metal surfaces, i.e., film separation due to heat history and poor adhesion to the base material. After Cr-plating the surface of a metal material, the Cr-plated surface is purified and activated by heating the metal material in a reactive gas containing halogen compounds or halogen, before the nitriding of the Cr-plated surface by heat application in a nitriding atmosphere.

It has also been known to provide minute holes on the surface so that the soot contained in the lubricating oil drops into the holes to minimize the increase of friction coefficient or wear caused by the soot.

SUMMARY OF THE INVENTION

The method of forming chromium nitride films according to Japanese Patent Application Laid-open No. H11-29848 involves a very complex process, wherein industrial Cr plating is performed to a base material such as steel, followed by special Cr coating such as high corrosion resistant Cr coating without cracks, macroporous Cr coating, and amorphous Cr coating containing 2% to 4% carbon, as well as the pretreatment with halogen, before the nitriding step. As shown in Working Examples 1 to 3 of Japanese Patent Application Laid-open No. H11-29848, the chromium nitride film thus obtained has a Vickers hardness of 1700 to 2000 HV. The difference in hardness between the chromium nitride film and the soft base material is so large that the adhesion is not sufficient for the wear resistance to be maintained over a long time.

If the surface treatment method of Japanese Patent Application Laid-open No. H11-29848 were applied to, chain components such as pins of timing chains, there would be problems of complex production process, high production cost, and wear resistance not being maintained favorable over a long time.

When providing a surface with minute holes, simply making it a rough surface with peaks and valleys would cause peaks only to contact the counter surface, which may cause an increase in surface pressure and damage the counter surface.

Peaks would have to be flattened as much as possible, but the more the peaks were flattened, the less satisfactory the valleys for the release of the soot would be, so that the soot removal effect may not be achieved sufficiently in applications with more soot or in operations for a long time. Also, the soot may accumulate in the valleys, build up, protrude, and eventually adversely affect the counter surface.

The present invention was made in view of such circumstances, and it is an object of the invention to provide a chain component that has a simple surface treatment structure and can maintain good wear resistance over a long time, and a chain that includes this chain component and maintains good wear elongation resistance.

The chain component according to the present invention is a chain component of a power transmission chain for industrial use and includes a steel base material and a chromium nitride layer formed on an outer side of the steel base material and containing more than 0 mass % but not more than 55 mass % iron, at least a surface of the chromium nitride layer that slides against other components being a rough surface with peaks and valleys.

The chain according to the present invention includes: a plurality of pairs of external plates, the paired external plates being connected by two pins; and a plurality of pairs of internal plates, the paired internal plates being connected by two bushings, the plurality of pairs of external plates and the plurality of pairs of internal plates being alternately interconnected with the pins loosely fitted in the bushings. At least one of the pin, the bushing, the internal plate, and the external plate is the chain component described above.

The chain according to the present invention includes: a plurality of pairs of external plates, the paired external plates being connected by two pins; and a plurality of pairs of internal plates, the paired internal plates being connected by two bushings each having a roller fitted thereon, the plurality of pairs of external plates and the plurality of pairs of internal plates being alternately interconnected with the pins loosely fitted in the bushings. At least one of the pin, the bushing, the internal plate, the external plate, and the roller is the chain component described above.

The chain according to the present invention is a chain made up of: a plurality of inner plates each having a pair of V-shape link teeth on one end in a short-side direction, and a pair of front and rear pin holes, the inner plates being pivotably interconnected by pins inserted in the pin holes such that one link tooth of one of adjacent inner plates overlaps the other link tooth of the other of the adjacent inner plates in a width direction of the chain; and guide plates which are arranged on both outer sides in the width direction and through which the pins are fixedly inserted. At least one of the pin, the inner plate, and the guide plate is the chain component described above.

The chain component according to the present invention has the chromium nitride layer formed on the outer side of the steel base material. The chain component has a simple surface treatment structure, and can be readily produced inexpensively with fewer process steps.

Chromium nitride has low friction coefficient and high toughness, so that the chain component formed with the chromium nitride layer exhibits low aggressiveness on counterparts, and hardly suffers damage by fine soot particles or the like having high hardness.

The chromium nitride layer generates low sliding friction heat because of the low friction coefficient. Since chromium nitride has a high oxidation onset temperature and is hardly oxidized even at high temperature, the wear resistance of the chain component is maintained favorably.

Since the chromium nitride layer contains iron, it exhibits good adhesion to the steel base material. The iron content is more than 0 mass % hut not more than 55 mass %, so that the wear resistance of the chain component is maintained over a long period of time.

The chromium nitride layer exhibits low aggressiveness on counterparts and suffers hardly any damage by fine soot particles or the like having high hardness, so that the degree of freedom in setting the range of clearance distance of sliding parts is increased.

At least a surface of the chromium nitride layer sliding against other components is a rough surface having peaks and valleys, so that the soot can be dropped into valleys on the rough surface and released from gaps, whereby the aggressiveness on counter surfaces is reduced.

The chromium nitride layer has high toughness, so that, even when only the peaks of the rough surface contact the counter surface and the surface pressure is increased, it does not damage the counter surface.

The chain of the present invention has good wear elongation resistance because it includes the chain component that exhibits the effects described above.

DESCRIPTION OF THE PREFERRED EMBODIMENTS

Figure 1:
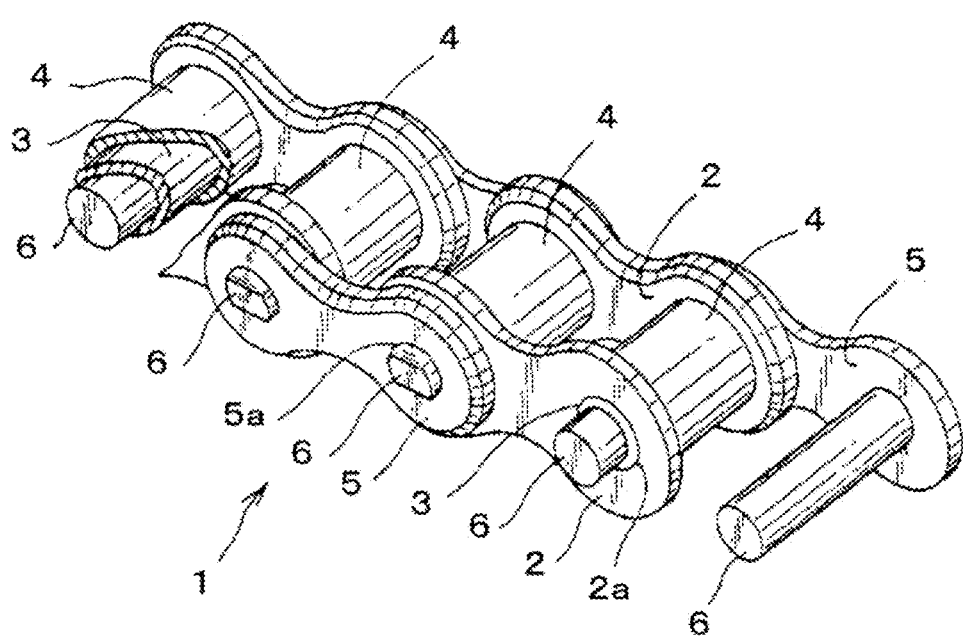
FIG. 1 is a perspective view illustrating part of one example of a roller chain.

A chain component according to the present invention includes a steel base material and a chromium nitride layer formed on an outer side of the steel base material.

The chromium nitride layer contains more than 0 mass % but not more than 55 mass % Fe. The lower limit of the Fe content should preferably be 1 mass %, more preferably 5 mass %, and even more preferably 8 mass %. The upper limit should preferably be 45 mass %, and more preferably 32 mass %.

The layer should preferably have a Fe distribution where the Fe concentration decreases gradually from the surface of the steel base member toward the outer side.

Cr and N contents should preferably decrease gradually from the outer side toward the surface of the steel base material.

The chromium nitride layer should preferably contain more than 0 mass % but not more than 55 mass % Fe, 45 mass % or more and 90 mass % or less Cr, and 5 mass % or more and 25 mass % or less N, based on 100 mass % of a total amount.

The lower limit of the Fe content should preferably be 1 mass %, more preferably 5 mass %, and even more preferably 8 mass %. The upper limit should preferably be 45 mass %, and more preferably 32 mass %.

The lower limit of the Cr content should preferably be 48 mass %, and more preferably 51 mass %. The upper limit should preferably be 77 mass %, and more preferably 67 mass %.

The lower limit of the N content should preferably be 9 mass %, and more preferably 13 mass %.

The values of Fe content are those determined by qualitative/quantitative analysis using an EPMA. The values of Cr and N contents are those determined by qualitative/quantitative analysis using an EPMA and corrected in consideration of the values of reference samples of chromium nitride.

The chromium nitride layer should preferably have a thickness of 2 μm or more and 30 μm or less. In this range, the surface roughness is small, cracks hardly form, and wear resistance is good, which leads to good wear elongation resistance of a chain having the chain component assembled therein.

An intermediate layer may be provided between the chromium nitride layer and the steel base material in order to increase the adhesion of the chromium nitride layer to the steel base material.

Examples of the intermediate layer include Cr, CrB, $CrB_2$, CrC, $Cr_2N$, $Cr_2O_3$, $CrSi_2$, CrNi, CrB—O, $CrB_2$—O, (V,Cr)C, (Cr,Zr)N, CrBN, $CrB_2$+Ni, (Cr,Mn)C, (Cr,No)N, (V,Cr)B, (Cr,Fe)C, (Cr,W)N, (Cr,Mn)B, (Cr,Co)C, (Cr,Cu)N, (Cr,Fe)B, (Cr,Ni)C, (Cr,V)N, (Cr,Co)B, (Cr,Cu)C, (Cr,Ni)B, (Cr,Zn)C, (Cr,Cu)B, (Cr,Zr)C, (Cr,Zn)B, (Cr,Nb)C, (Cr,Zr)B, (Cr,Mo)C, (Cr,Nb)B, (Cr,Hf)C, (Cr,Mo)B, (Cr,Ta)C, (Cr,Hf)B, (Cr,W)C, (Cr,Ta)B, (Cr,W)B, and the like.

The chromium nitride layer on the chain component according to the present invention is formed on the outer side of the steel base material in the following manner: the steel base material and a treatment agent containing Cr powder, aluminum oxide (hereinafter referred to as alumina), and ammonia halide are placed in a heating furnace; the temperature of the heating furnace is raised to a target value; and after the temperature is kept for a predetermined time, the heating furnace is slowly cooled down. The treatment agent can contain a compound, which the element contained in the intermediate layer mentioned above originates from.

Hereinafter, a chain component according to the present invention will be described, wherein the component is pins of a roller chain used as a timing chain or the like of a car engine.

FIG. 1 is a perspective view illustrating part of one example of a roller chain 1.

The roller chain 1 has bushings 3 press-fit at both ends into bushing holes 2a of a pair of internal plates 2, and pins 6 fitted in the bushings 3 and press-fit at both ends into pin holes 5a of a pair of external plates 5 that are arranged on both outer sides of the pair of internal plates 2. Rollers 4 are fitted on the bushings 3.

The chromium nitride layer described above is provided on the outer side of the pins 6.

Hereinafter, the method of producing the pins 6 as one example of chain component according to the present invention will be described.

Wire rods of carbon steel, chromium-molybdenum steel (SCM), or high-carbon chromium bearing steel (SUJ) and the like are used as the steel base material of the pins 6.

The chromium nitride layer is formed on the surface of the steel base material of the pins 6 by diffusion coating of Cr and N.

For the Cr diffusion coating process, the process referred to as "powder pack" method can be adopted.

More specifically, the pin 6 and a treatment agent containing Cr powder, alumina, and ammonium halide are packed in an alumina boat, for example, which is then placed in a heating furnace such as an electric furnace, for example. The treatment agent should preferably contain 50 to 67 mass % Cr powder, 30 to 37 mass % alumina, and 0.2 to 3 mass % ammonium halide based on 100 mass % of a total amount.

Examples of ammonium halide include ammonium chloride, ammonium bromide, ammonium iodide, ammonium fluoride and the like. One type or two or more types of ammonium halide are selected in accordance with the target layer structure.

The atmosphere is replaced with an inert gas such as Ar or $N_2$ before raising the temperature.

The temperature is then raised to a predetermined level.

During the heating, a preset flow amount of $NH_3$ and/or $N_2$ may be introduced in accordance with the thickness, film configuration, total film thickness and the like of the target chromium nitride layer.

The furnace is cooled down after keeping the temperature for a predetermined period of time.

If the target film has not been formed yet, the furnace is again heated to the predetermined temperature while introducing $NH_3$ and/or $N_2$, and cooled down after holding the temperature for a preset time.

The composition ratio of the treatment agent, treatment temperature, and holding time are determined in consideration of the composition of the steel base material, and the thickness, film configuration, total film thickness and the like of the target chromium nitride layer.

Nitridation of the surface or CrC layer of the steel base material is one example of method of forming a chromium nitride layer.

According to this method of forming a chromium nitride layer, a chromium nitride layer can be formed on the outer side of the steel base material easily and inexpensively with a few process steps. Cr, C, and Fe have concentration gradients, and good adhesion between the chromium nitride layer and the steel base material is achieved.

The chain component obtained by the production method described above has good wear resistance since it has the chromium nitride layer on the outer side, which has a high oxidation onset temperature and is hardly oxidized even at high temperature. Also, good wear elongation resistance is maintained for a long period of time because of the good adhesion between the chromium nitride layer and the steel base material.

While one example has been described above wherein the chromium nitride layer is formed on the pin 6, the target is not limited to the pin. The chromium nitride layer may be formed on the surface of at least one of the internal plate 2, bushing 3, roller 4, and external plate 5.

The chain 1 having the chain component according to the present invention maintains good wear elongation resistance over a long period of time.

The chain according to the present invention may be a bushing chain that does not have rollers.

The chain according to the present invention may be a silent chain.

Figure 2:
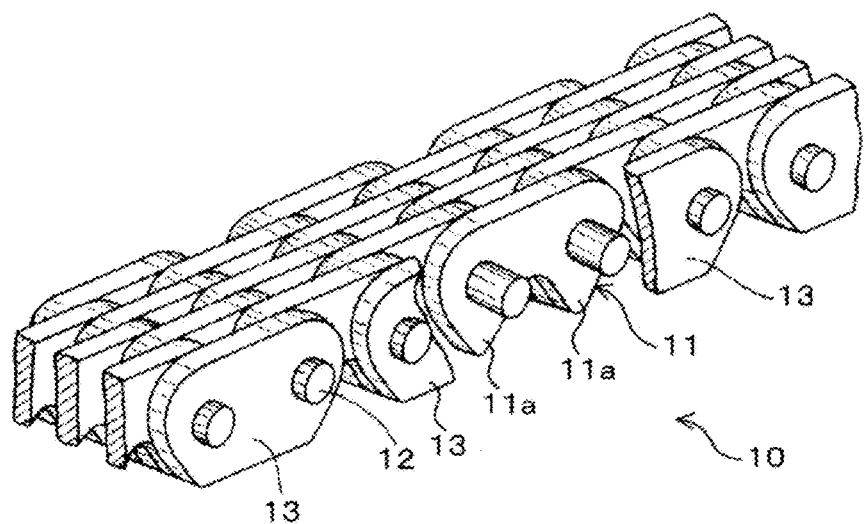
FIG. 2 is a perspective view illustrating part of one example of a silent chain.

FIG. 2 is a perspective view illustrating part of one example of a silent chain 10.

The silent chain 10 is made up of a plurality of inner plates 11 each having a pair of V-shape link teeth 11a on one end in the short-side direction, and guide plates 13 which are arranged on both outer sides in a width direction of the silent chain 10 and through which pins are fixedly inserted. The inner plates 11 are pivotably interconnected by pins 12 inserted in pin holes such that one link tooth 11a of one of adjacent inner plates 11 overlaps the other link tooth 11a of the other of the adjacent inner plates 11 in the width direction.

The silent chain 10 includes the chromium nitride layer on the surface of at least one of the chain components including the inner plates 11, pins 12, and guide plates 13.

EXAMPLES

The present invention will be described below in more specific terms based on working examples.

Working Example 1

An SUJ2 wire rod was used as the processed material of Working Example 1, which was cut to a predetermined length and ground, to obtain a pin 6 material, as the steel base material.

A treatment agent containing Cr powder, alumina, and NH₄Cl each in an amount within the ranges specified above, was set in an alumina boat with the pin 6, and the alumina boat was placed in a heating furnace. After replacement with an inert gas, the furnace was heated to the preset temperature while introducing a suitable flow amount of an additive gas (NH₃ and N₂). The temperature was held for a while to form a chromium nitride layer on the outer side of the pin 6. The heater power source was turned off after that and the furnace was cooled down slowly.

A pin 6 with a chromium nitride layer formed on the outer side of the steel base material was thus obtained.

The chromium nitride layer contained 13 mass % Fe, 74 mass % Cr, and 13 mass % N, and had a thickness of 13 μm.

Figure 3:
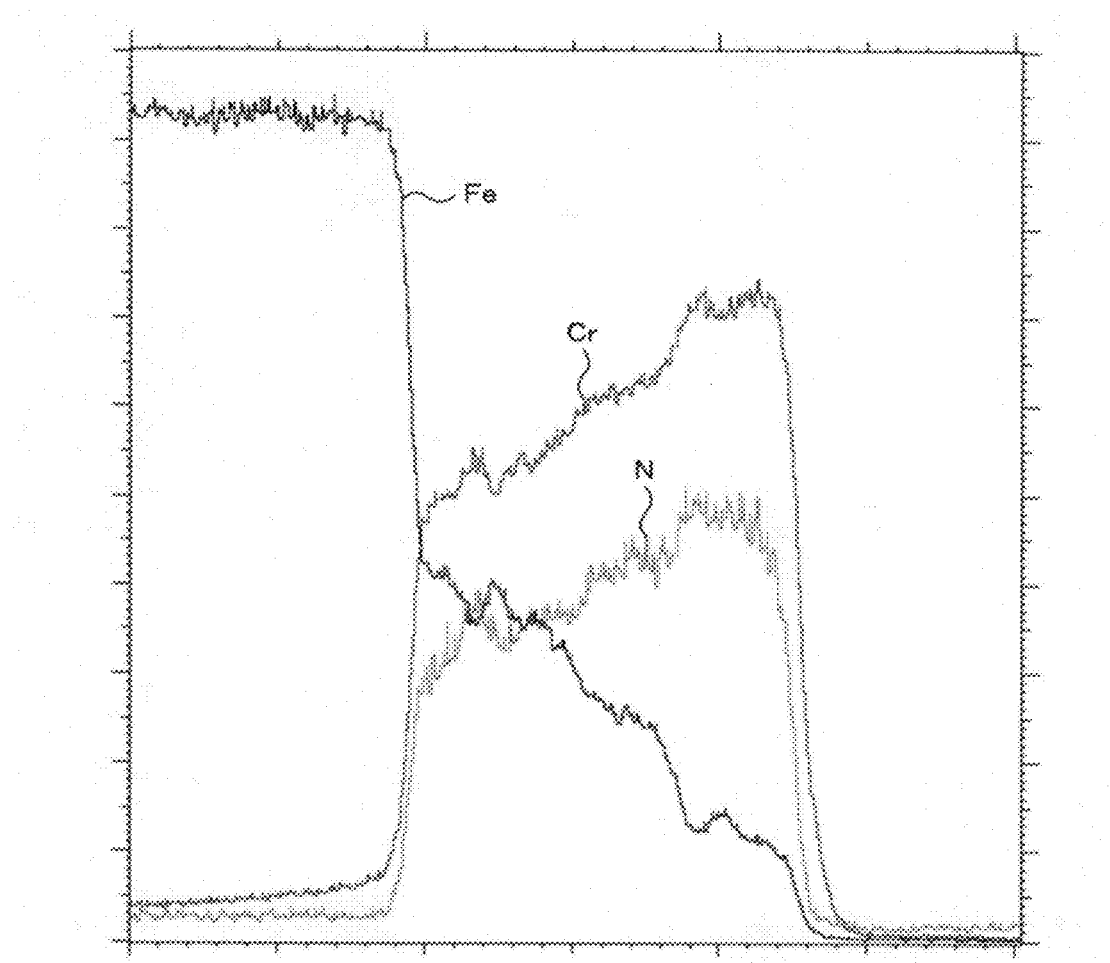
FIG. 3 is a graph showing a composition distribution of Fe, Cr, and N in a cross section of a pin of Working Example 1 determined by line analysis using an electron probe micro-analyzer (EPMA)

FIG. 3 is a graph showing a composition distribution of Fe, Cr, and N in a cross section of the pin 6 of Working Example 1 determined by line analysis using an EPMA. The horizontal axis represents the length in the thickness direction, and the vertical axis represents the detection intensity of each component.

The measurement conditions were as follows.
Acceleration voltage: 15 kV
Sample current: 50 nA
Beam diameter: 1 μm FIG. 3 indicates that the Fe content gradually increases, while the Cr and N contents gradually decrease, from the outer side toward the surface of the base material of the pin 6.

The above results confirmed that a chromium nitride layer was formed on the outer side of the steel base material wherein Cr and N diffused in part on the surface side of the pin 6 material. Cr and N have concentration gradients because they diffused. The layer also has a Fe concentration distribution where the Fe content decreases gradually from the surface of the steel base material toward the outer side. Because of these concentration gradients of Fe, Cr, and N, it can be seen that there is good adhesion between the base material of the pin 6 and the chromium nitride layer.

Comparative Example 1

Pins as Comparative Example 1 were obtained by a conventional powder pack method, wherein a 15 μm thickness CrC layer was formed on a steel base material.

Comparative Example 2

Pins as Comparative Example 2 were obtained by a conventional PVD method, wherein a 6 μm thickness chromium nitride layer was formed on a steel base material.

Roller chains were assembled using the pins 6 of Working Example 1, the pins of Comparative Example 1, and the pins of Comparative Example 2.

The wear elongation resistance of each roller chain was evaluated.

A car was actually driven 5000 km, 10,000 km, and 15,000 km in town using an SAE 5W-30 engine oil, and the deteriorated engine oil was collected after each drive.

Using each engine oil, the roller chains each including the pins of Working Example 1, Comparative Example 1, and Comparative Example 2 were tested under severe conditions where they were run at high speed for 100 hours. The results are shown in Table 1. Table 1 indicates the wear elongation in percentage (wear elongation ratio) of Working Example 1 and Comparative Example 2 in relation to that of the roller chain of Comparative Example 1 as 100.

TABLE 1

| Driving distance (km) | Working Example 1 | Comparative Example 1 | Comparative Example 2 (%) |
|---|---|---|---|
| 5000 | 80 | 100 | 118 |
| 10,000 | 70 | 100 | 146 |
| 15,000 | 63 | 100 | 182 |

Table 1 indicates that Working Example 1 had better wear elongation resistance than Comparative Example 1, which had better wear elongation resistance than Comparative Example 2. Namely, it can be seen that the roller chain 1 of Working Example 1, which has a chromium nitride layer containing more than 0 mass % but not more than 55 mass % Fe on the outer side of the steel base material, has good wear elongation resistance. With an increase in the driving distance (as the engine oil is more deteriorated), the effect of improving the wear elongation resistance by the chromium nitride layer is increased.

Figure 4:
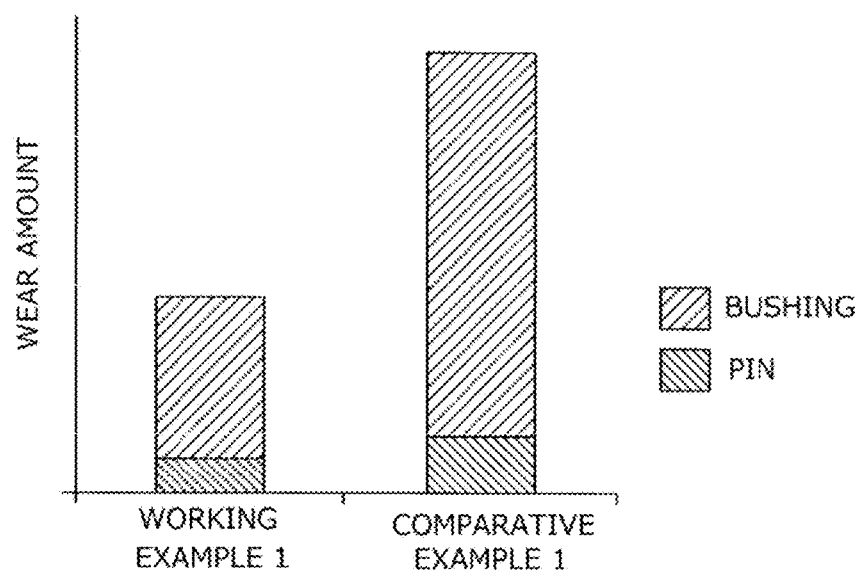
FIG. 4 is a graph showing the results of investigation on the amount of wear on pins and bushings in which the pins are fitted, of a roller chain using the pins of Working Example 1 and of a roller chain using the pins of Comparative Example 1, after a predetermined time of operation of the chain.

FIG. 4 is a graph showing the results of investigation on the amount of wear on pins and bushings in which the pins are fitted, of a roller chain using the pins 5 of Working Example 1 and of a roller chain using the pins of Comparative Example 1, after a predetermined time of operation of the chain.

FIG. 4 shows that the amount of wear on pins and bushings is reduced when the roller chain having the pins 6 of Working Example 1 is used, as compared to when the roller chain having pins of Comparative Example 1 is used. The wear on bushings is reduced particularly largely. This is because the chromium nitride layer on the pins 6 of Working Example 1 exhibits low aggressiveness on the sliding counterparts (bushings).

Figure 5:
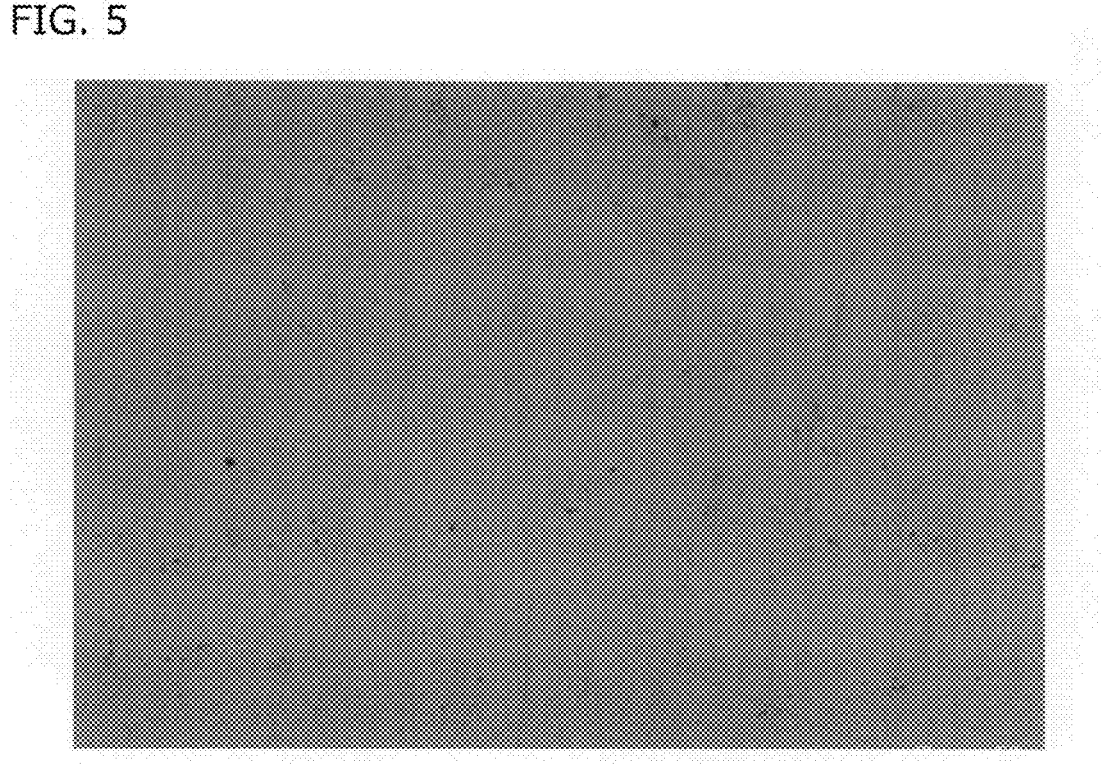
FIG. 5 is an optical microscopic image of the surface of the pin according to Working Example 1.
Figure 6:
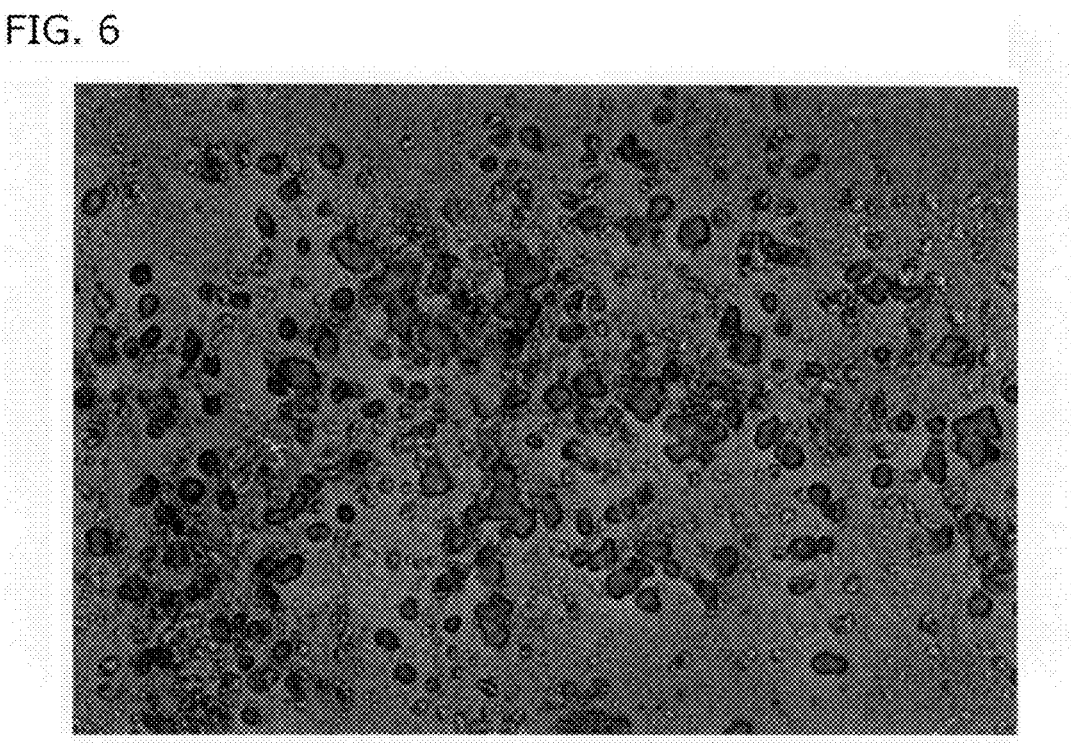
FIG. 6 is an optical microscopic image of the surface of the pin according to Comparative Example 2.

FIG. 5 is an optical microscopic image showing the surface of the pin 6 of Working Example 1. FIG. 6 is an optical microscopic image showing the surface of the pin of Comparative Example 2.

While no droplets are present on the surface of the pin 6 of Working Example 1 in FIG. 5, there are a large number of droplets on the surface of the pin of Comparative Example 2. It can be seen that the pin of Comparative Example 2 has a larger surface roughness and will have poorer wear resistance because of cracks that will start from the droplets.

Next, the results of the wear elongation resistance evaluation test will be described. The test was conducted using deteriorated engine oil, with varying Fe content in the chromium nitride layer on the roller chain.

Similarly to Working Example 1, pins 6 of Working Examples 2 to 6 and pins of Comparative Example 3 were fabricated, each with the element composition as specified in Table 2 below. Table 2 also shows Working Example 1 and Comparative Example 1.

The values of Fe content, of the elements in Table 2, are those determined by qualitative/quantitative analysis using an EPMA. The values of Cr and N contents are those determined by qualitative/quantitative analysis using an EPMA and corrected in consideration of the values of reference samples of chromium nitride.

The results of the wear elongation resistance evaluation test, which was conducted using deteriorated engine oil, with varying thickness of the chromium nitride layer on the roller chain, will be described.

A car was actually driven 10,000 km in town using an SAE 0W-30 engine oil, and the deteriorated engine oil was collected and used in the test.

Using this engine oil, the roller chains each including the pins of various working examples with various different thicknesses of the chromium nitride layer were tested under severe conditions where they were run at high speed for 180 hours.

Figure 8:
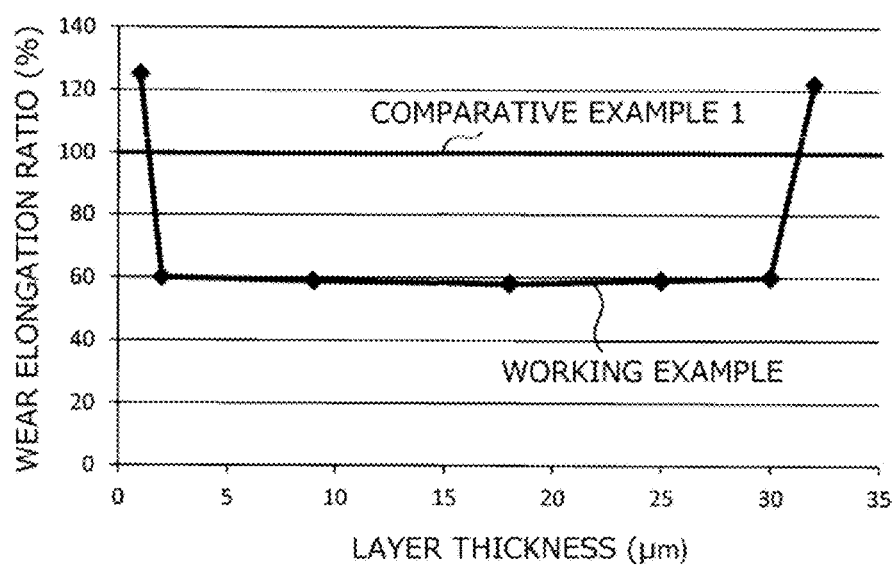
FIG. 8 is a graph showing the relationship between the thickness of the chromium nitride layer and the wear elongation ratio.

FIG. 8 is a graph showing the relationship between the thickness of the chromium nitride layer and the wear elongation ratio. The horizontal axis represents the layer thickness ($\mu m$), and the vertical axis represents the percentage of wear elongation resistance (%) in relation to that of the roller chain of Comparative Example 1 as 100.

FIG. 8 shows that the wear elongation resistance is favorable when the thickness of the chromium nitride layer is 2 $\mu m$ or more and 30 $\mu m$ or less. When the layer thickness is more than 30 $\mu m$, cracks form and deteriorate the wear elongation resistance.

TABLE 2

|  | Working Example 2 | Working Example 3 | Working Example 4 | Working Example 1 | Working Example 5 | Working Example 6 | Comparative Example 1 | Comparative Example 3 (%) |
|---|---|---|---|---|---|---|---|---|
| Cr | 90 | 77 | 67 | 74 | 51 | 45 |  | 30 |
| N | 9 | 18 | 25 | 13 | 17 | 5 |  | 15 |
| Fe | 1 | 5 | 8 | 13 | 32 | 55 |  | 60 |
| Total | 100 | 100 | 100 | 100 | 100 | 105 |  | 105 |
| Wear elongation ratio | 80 | 67 | 60 | 59 | 60 | 98 | 100 | 122 |

A was actually driven 10,000 km in town using an SAE 0W-20 engine oil, and the deteriorated engine oil was collected and used in the test.

Using this engine oil, the roller chains each including the pins of Working Examples 1 to 6, Comparative Example 1, and Comparative Example 3 were tested under severe conditions where they were run at high speed for 150 hours. The results are shown in Table 2. Table 2 indicates the wear elongation in percentage (wear elongation ratio) of various working examples and Comparative Example 3 in relation to that of the roller chain of Comparative Example 1 as 100.

Figure 7:
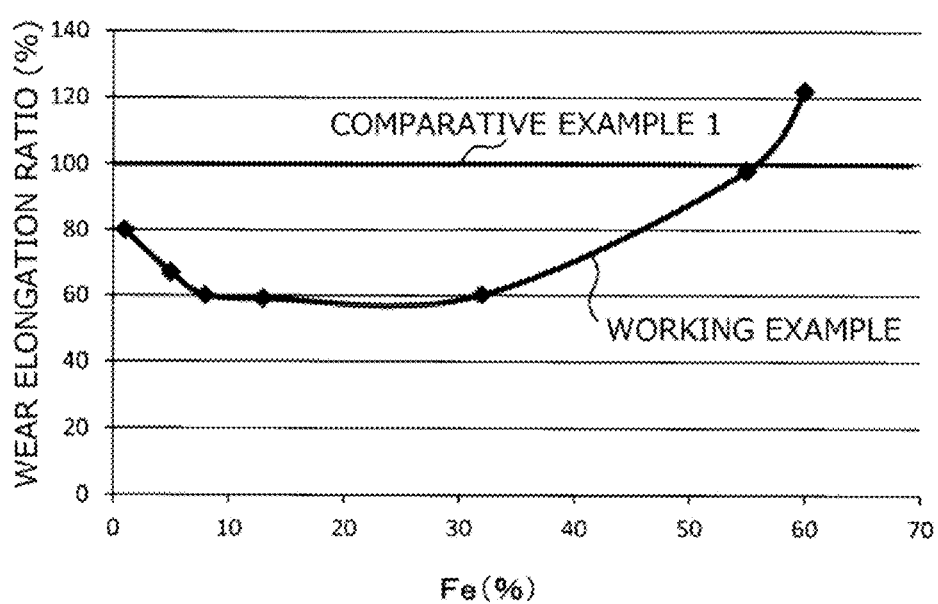
FIG. 7 is a graph showing the relationship between the Fe content in the chromium nitride layer and the wear elongation ratio.

FIG. 7 is a graph showing the relationship between the Fe content in the chromium nitride layer and the wear elongation ratio. The horizontal axis represents the Fe content (mass %), and the vertical axis represents the wear elongation ratio (%).

Table 2 and FIG. 7 show that the roller chains 1 of various working examples that have a chromium nitride layer containing more than 0 mass % but not more than 55 mass % Fe have good wear elongation resistance.

The lower limit of the Fe content should preferably be 1 mass %, more preferably 5 mass %, and even more preferably 8 mass %. The upper limit should preferably be 45 mass %, and more preferably 32 mass %.

The lower limit of the Cr content should preferably be 48 mass %, and more preferably 51 mass %. The upper limit should preferably be 77 mass %, and more preferably 67 mass %.

The lower limit of the N content should preferably be 9 mass %, and more preferably 13 mass %.

As demonstrated above, it was confirmed that the chromium nitride layer of the pins 5 according to working examples of the present invention had no droplets so that it would hardly peel off, the layer would exhibit low aggressiveness on the counterparts, and since the layer thickness could be in the range of 2 $\mu m$ to 30 $\mu m$, the roller chain 1 would have good wear elongation resistance that would be maintained favorable over a long period of time.

Figure 9A:
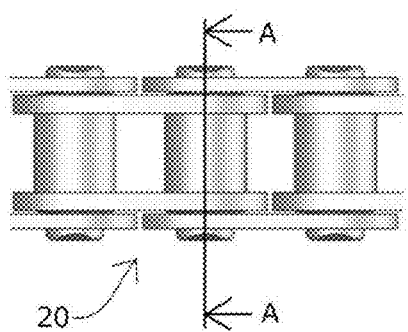
FIG. 9A is a view of a bushing chain.
Figure 9B:
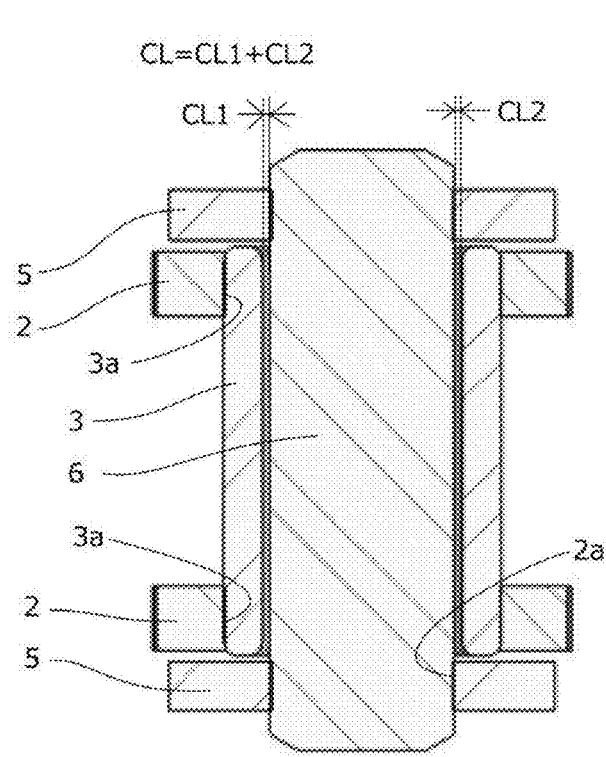
FIG. 9B is a cross-sectional view illustrating clearances between a pin and bushing of a bushing chain.

Next, the results of the test conducted with the use of deteriorated engine oil on the bushing chain 20 shown in FIGS. 9A and 9B will be described.

Generally, the clearance distance CL between the pin 6 and the inner circumference of the bushing 3 is designed small for better wear resistance, to reduce the surface pressure on bearing parts when tension is applied.

However, too small a clearance distance CL leads to poorer twistability and flexibility of the entire chain and poorer assemblability to the engine, as well as to a lower strength because of the load applied by the chain itself.

Too small a clearance distance CL also allows soot or the like in the engine oil to accumulate more readily. The friction coefficient will increase by the damage caused by the soot or the like on the surfaces of the pins and inner circumference of the bushings, which can cause heat generation and an increase in resistance and wear.

Accordingly, the clearance distance CL is strictly designed in a very small range in accordance with the purpose and environment of use in consideration of the relationship between reduction of the surface pressure on bearing parts when tension is applied and other influences.

According to the present invention, by the application of the low-friction and high-toughness chromium nitride layer on the surface, the clearance distance CL can be increased, which increases the surface pressure on the bearing parts, without loss of wear resistance.

Since the chromium nitride layer exhibits low aggressiveness on counterparts and suffers little damage by fine soot particles having high hardness, the clearance distance CL can be decreased to allow soot or the like to more readily accumulate with less possibility of damage by the soot on the surfaces of the pins and inner circumference of the bushings, which in turn reduces the possibilities of heat generation and increased resistance or wear caused by an increased friction coefficient.

This increases the degree of freedom in setting the clearance distance CL and thus makes it possible to flexibly deal with various purposes and changes in the environment of use.

More specifically, it was confirmed that the chain could be used without problems with the clearance distance CL between the pins 6 and bushings 3 being in the range of 30 μm to 120 μm.

It as also confirmed that the chain could be used without problems when $60 \geq CL/N \geq 2.8$ where N is the thickness of the chromium nitride layer, and that the clearance distance CL could be made sufficiently large even if the layer thickness was small.

Figure 10:
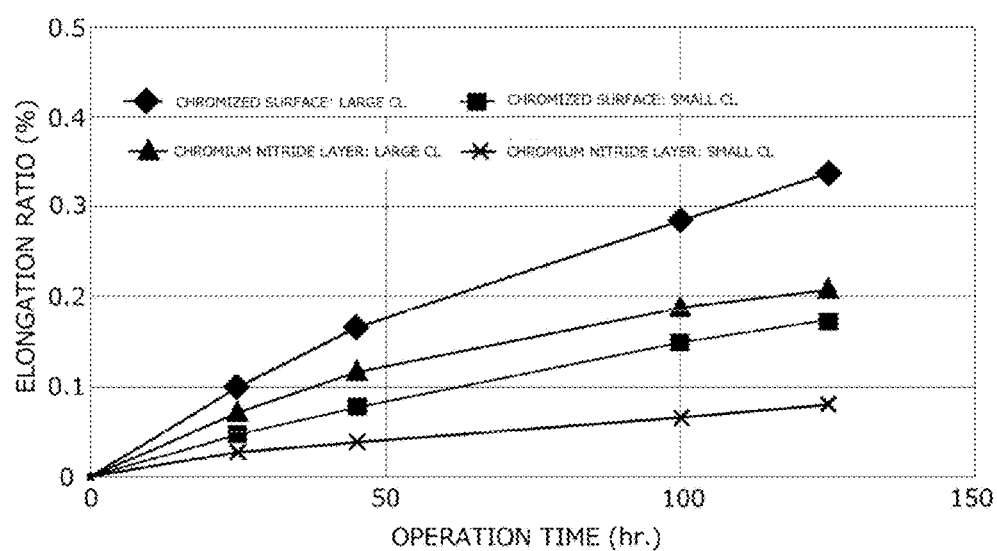
FIG. 10 is a graph showing the wear amount plotted against time of pins and bushings when the clearance and surface layer are different.

FIG. 10 shows changes in wear elongation plotted against time of a chain with a conventional chromizing treatment on the surface of the pins 6 and the chain with the chromium nitride layer of the present invention when deteriorated engine oil was used.

The elongation of the chain with the chromium nitride layer of the present invention was doubtless reduced irrespective of the clearance distance CL.

Even when the clearance distance CL was large, elongation of the chain with the chromium nitride layer of the present invention was more or less the same as that of the chain with the conventional chromizing treatment when the clearance distance CL was small, which confirmed that the degree of freedom in setting the clearance distance CL was increased.

FIGS. 11A to 11D show images of the surface conditions of the pin with the conventional chromizing treatment and the pin with the chromium nitride layer of the present invention.

Figure 11A:
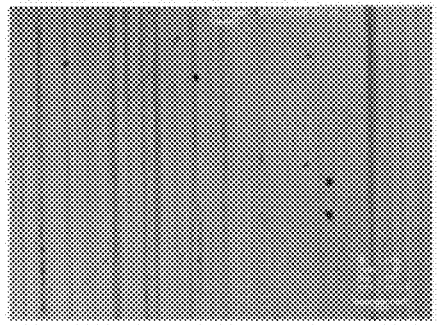
FIGS. 11A to 11D are optical microscopic surface images when deteriorated engine oil was used, FIGS. 11A and 11C being those of conventional examples and FIGS. 11B and 11D being those of the present invention.
Figure 11B:
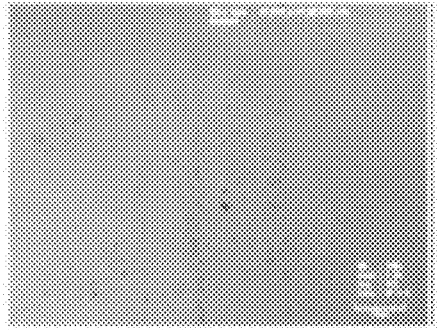
Figure 11C:
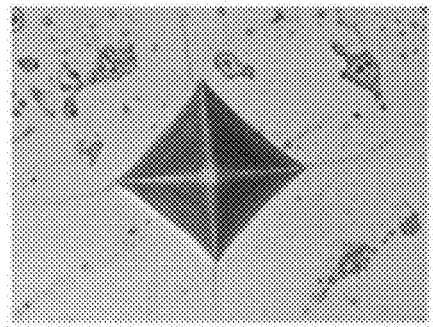
Figure 11D:
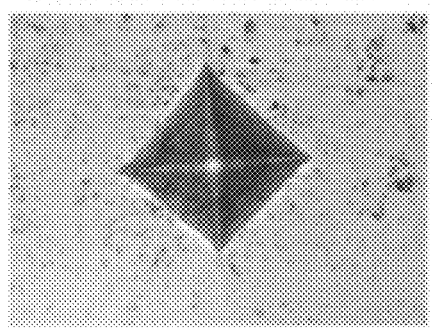

FIG. 11A and FIG. 11B show scratched surface conditions of the pin with the conventional chromizing treatment and the pin with the chromium nitride layer of the present invention when deteriorated engine oil was used. FIG. 11C and FIG. 11D show the surface conditions with brinelling of the pin with the conventional chromizing treatment and the pin with the chromium nitride layer of the present invention when a Vickers hardness test was conducted.

As can be seen from the scratch conditions in FIG. 11A and FIG. 11B, while the pin with the conventional chromizing treatment had many scratches, the pin with the chromium nitride layer of the present invention had hardly any scratch because of the low friction coefficient and high toughness.

As can be seen from FIG. 11C and FIG. 11D, while the pin with the conventional chromizing treatment had cracks around the brinelling, the pin with the chromium nitride layer of the present invention showed no cracks because of the high toughness.

Figure 12:
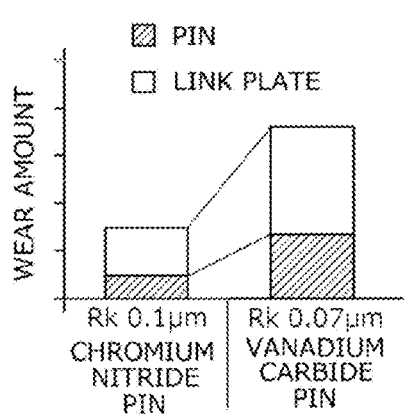
FIG. 12 is a graph showing the amount of wear plotted against time when the surface is roughened.
Figure 12:
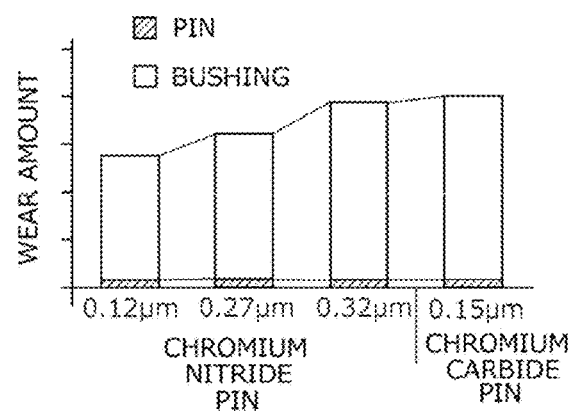

FIG. 12 is a graph showing the amount of wear on sliding surfaces when the sliding surface of the chromium nitride layer of the present invention was provided with a surface roughening treatment.

The graph on the left side of FIG. 12 shows the wear amount on the surface-treated pins of a silent chain after 100 hours of operation using deteriorated 0W-16 oil containing soot.

The wear amount was very small both on pins and link plates, with the pins having the chromium nitride layer of the present invention, as compared to when pins having a conventional vanadium carbide layer were used.

The graph on the right side of FIG. 12 shows the wear amount on the surface-treated pins of a bushing chain after 100 hours of operation using deteriorated 0W-16 oil containing soot.

With the pins having the chromium nitride layer of the present invention, while the wear on the pins was substantially the same as compared to when pins having a conventional vanadium carbide layer were used, the wear on the bushings, which is the counter surface, was small irrespective of the surface roughness.

With the pins having the chromium nitride layer of the present invention, the surface roughness could be increased to 0.32 μm and the wear amount on the bushings, which was the counter surface, was still smaller than that of the pins having a conventional chromium carbide layer with a surface roughness of 0.15 μm, which suggests that the effect of removing soot could be achieved sufficiently even in an environment with even more soot.

As described above, the chain component according to the present invention is a chain component of a power transmission chain for industrial use and characterized in that it includes a steel base material and a chromium nitride layer formed on an outer side of the steel base material and containing more than 0 mass % but not more than 55 mass % iron, at least a surface of the chromium nitride layer that slides against other components being a rough surface with peaks and valleys.

According to the present invention, the surface roughness Rk is in the range of 0.05 μm to 0.5 μm, so that soot contained in deteriorated engine oil and having a particle size that does not fit in gaps between peaks and valleys on the surface can be satisfactorily removed from sliding surfaces whereby aggressiveness on counter surfaces can be mitigated.

Other surface roughness parameters can be used instead of Rk as long as they represent a range of values substantially equivalent to the range of Rk of 0.05 μm to 0.5 μm.

According to the present invention, the chromium nitride layer is formed on the outer side of the steel base material. The chain component has a simple surface treatment structure, and can be readily produced inexpensively with fewer process steps.

Chromium nitride has low friction coefficient, so that the chain component formed with the chromium nitride layer exhibits low aggressiveness on counterparts. The chromium nitride layer generates low sliding friction heat. Moreover, chromium nitride has a high oxidation onset temperature and is hardly oxidized even at high temperature, so that the wear resistance of the chain component is maintained favorably.

Since the chromium nitride layer contains iron, it exhibits good adhesion to the steel base material. Also, since the iron content is more than 0 mass % but not more than 55 mass %, the wear resistance of the chain component is maintained over a long period of time.

The chain component according to the present invention is further characterized in that the chromium nitride layer has an iron concentration distribution where iron concentration decreases gradually from a surface of the steel base material toward an outer side.

According to the present invention, the adhesion to the steel base material is even more favorable.

The chain component according to the present invention is further characterized in that the chromium nitride layer has chromium and nitrogen concentration distributions where chromium and nitrogen concentrations decrease gradually from an outer side toward the surface of the steel base material.

According to the present invention, the adhesion to the steel base material is even more favorable.

The chain component according to the present invention is further characterized in that the iron content is mass % or more and 45 mass % or less.

According to the present invention, the wear resistance is even better.

The chain component according to the present invention is further characterized in that the chromium nitride layer contains more than 0 mass % but not more than 5 mass % iron, 45 mass % or more and 90 mass % or less chromium, and 5 mass % or more and 25 mass % or less nitrogen based on 100 mass % of a total amount.

According to the present invention, the wear resistance is maintained more favorably, and the adhesion to the steel base material is even better.

The chain component according to the present invention is further characterized in that the chromium nitride layer has a thickness of 2 μm or more and 30 μm or less.

According to the present invention, the surface roughness is small, cracks hardly form, and wear resistance is good.

The chain according to the present invention includes: a plurality of pairs of external plates, the paired external plates being connected by two pins; and a plurality of pairs of internal plates, the paired internal plates being connected by two bushings, the plurality of pairs of external plates and the plurality of pairs of internal plates being alternately interconnected with the pins loosely fitted in the bushings, and characterized in that at least one of the pin, the bushing, the internal plate, and the external plate is one of the chain components described above.

The bushing chain of the present invention has good wear elongation resistance.

The chain according to the present invention includes: a plurality of pairs of external plates, the paired external plates being connected by two pins; and a plurality of pairs of internal plates, the paired internal plates being connected by two bushings each having a roller fitted thereon, the plurality of pairs of external plates and the plurality of pairs of internal plates being alternately interconnected with the pins loosely fitted in the bushings, and characterized in that at least one of the pin, the bushing, the internal plate, the external plate, and the roller is one of the chain components described above.

The roller chain of the present invention has good wear elongation resistance.

The chain according to the present invention is further characterized in that at least one of the pin and the bushing is one of the chain components described above, and that a clearance distance between the pin and the bushing is 30 μm to 120 μm.

The chain of the present invention has good wear elongation resistance and can flexibly deal with various purposes and changes in the environment of use.

The chain according to the present invention is a chain made up of a plurality of inner plates each having a pair of V-shape link teeth on one end in a short-side direction, the inner plates being pivotably interconnected by pins inserted in the pin holes such that one link tooth of one of adjacent inner plates overlaps the other link tooth of the other of the adjacent inner plates in a width direction of the chain, and guide plates which are arranged on both outer sides in the width direction and through which the pins are fixedly inserted, and characterized in that at least one of the pin, the inner plate, and the guide plate is one of the chain components described above.

The silent chain of the present invention has good wear elongation resistance.

The chain according to the present invention is further characterized in that at least one of the pin and the inner plate is one of the chain components described above, and that a clearance distance between the pin and the pin hole in the inner plate in sliding contact with the pin is 30 μm to 120 μm.

The chain of the present invention has good wear elongation resistance and can flexibly deal with various purposes and changes in the environment of use.

It should be interpreted that the embodiments disclosed herein are given for illustrative and not restrictive purposes in all features. The scope of the present invention shall not be determined by the description above and is intended to include contents equivalent to the claims and all changes made within the scope of the claims.

For example, the chain component of the present invention is not limited to components of the roller chain, bushing chain, and silent chain described above. Also, the chain component can be applied to components of power transmission chains for industrial use other than timing chains.

What is claimed is:

1. A chain component of a power transmission chain for industrial use, the chain component comprising:
   a steel base material; and
   a chromium nitride layer formed on an outer surface of the steel base material and containing more than 0 mass % but not more than 55 mass % iron.

2. The chain component according to claim 1, wherein at least a part of an outer surface of the chromium nitride layer has a surface roughness Rk of 0.05 μm to 0.5 μm.

3. The chain component according to claim 1, wherein the chromium nitride layer has an iron concentration distribution where iron concentration decreases gradually from a surface of the steel base material toward an outer surface of the chromium nitride layer.

4. The chain component according to claim 1, wherein the chromium nitride layer has chromium and nitrogen concentration distributions where chromium and nitrogen concentrations decrease gradually from an outer surface of the chromium nitride layer toward a surface of the steel base material.

5. The chain component according to claim 1, wherein the content of the iron is 1 mass % or more and 45 mass % or less.

6. The chain component according to claim 1, wherein the chromium nitride layer contains more than 0 mass % but not more than 55 mass % iron, 45 mass % or more and 90 mass % or less chromium, and 5 mass % or more and 25 mass % or less nitrogen based on 100 mass % of a total amount.

7. The chain component according to claim 1, wherein the chromium nitride layer has a thickness of 2 μm or more and 30 μm or less.

8. A chain comprising:
a plurality of pairs of external plates, each pair of external plates among the plurality of pairs of external plates being connected by two pins; and
a plurality of pairs of internal plates, each pair of internal plates among the plurality of pairs of internal plates being connected by two bushings,
the plurality of pairs of external plates and the plurality of pairs of internal plates being alternately interconnected with the pins loosely fitted in the bushings,
at least one of the pin, the bushing, the internal plate, and the external plate being the chain component according to claim 1.

9. A chain comprising:
a plurality of pairs of external plates, each pair of external plates among the plurality of pairs of external plates being connected by two pins; and
a plurality of pairs of internal plates, each pair of internal plates among the plurality of pairs of internal plates being connected by two bushings each having a roller fitted thereon,
the plurality of pairs of external plates and the plurality of pairs of internal plates being alternately interconnected with the pins loosely fitted in the bushings,
at least one of the pin, the bushing, the internal plate, the external plate, and the roller being the chain component according to claim 1.

10. The chain according to claim 8, wherein at least one of the pin and the bushing is the chain component, and
the inner diameter of the bushing is 30 μm to 120 μm larger than the outer diameter of the pin.

11. A chain comprising:
a plurality of inner plates each having a pair of V-shape link teeth on a side thereof, and a pair of front and rear pin holes, the inner plates being pivotably interconnected by pins inserted in the pin holes such that one link tooth of one of adjacent inner plates overlaps the other link tooth of the other of the adjacent inner plates in a width direction of the chain; and
guide plates which are arranged on left and right outer sides in the width direction of the chain and through which the pins are fixedly inserted,
at least one of the pin, the inner plate, and the guide plate being the chain component according to claim 1.

12. The chain according to claim 11, wherein at least one of the pin and the inner plate is the chain component, and
the inner diameter of the pin hole of the inner plate is 30 μm to 120 μm larger than the outer diameter of the pin.

* * * * *